US010090396B2

United States Patent
Wu et al.

(10) Patent No.: US 10,090,396 B2
(45) Date of Patent: Oct. 2, 2018

(54) METHOD FOR FABRICATING METAL GATE DEVICES AND RESULTING STRUCTURES

(71) Applicant: TAIWAN SEMICONDUCTOR MANUFACTURING CO., LTD., Hsinchu (TW)

(72) Inventors: Po-Chi Wu, Zhubei (TW); Chai-Wei Chang, New Taipei (TW); Jung-Jui Li, Hsinchu (TW); Ya-Lan Chang, Toufen Township (TW); Yi-Cheng Chao, Lukang Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 14/831,409

(22) Filed: Aug. 20, 2015

(65) Prior Publication Data
US 2017/0025514 A1     Jan. 26, 2017

Related U.S. Application Data

(60) Provisional application No. 62/194,736, filed on Jul. 20, 2015.

(51) Int. Cl.
| | |
|---|---|
| *H01L 21/8234* | (2006.01) |
| *H01L 29/49* | (2006.01) |
| *H01L 21/28* | (2006.01) |
| *H01L 21/321* | (2006.01) |
| *H01L 21/3213* | (2006.01) |

(Continued)

(52) U.S. Cl.
CPC .... *H01L 29/4958* (2013.01); *H01L 21/02074* (2013.01); *H01L 21/28079* (2013.01); *H01L 21/28088* (2013.01); *H01L 21/3212* (2013.01); *H01L 21/32133* (2013.01); *H01L 21/32135* (2013.01); *H01L 21/32136* (2013.01); *H01L 29/4966* (2013.01); *H01L 29/7851* (2013.01)

(58) Field of Classification Search
CPC ............ H01L 27/0924; H01L 27/0886; H01L 27/1211; H01L 27/10879; H01L 29/66795; H01L 21/82345; H01L 21/823842; H01L 29/66545; H01L 29/66871; H01L 29/66606
See application file for complete search history.

(56) References Cited

U.S. PATENT DOCUMENTS

| | | |
|---|---|---|
| 6,830,998 B1 | 12/2004 | Pan et al. |
| 6,992,009 B2 | 1/2006 | Kodera et al. |
| 9,012,319 B1 | 4/2015 | Choi et al. |

(Continued)

FOREIGN PATENT DOCUMENTS

| | | |
|---|---|---|
| CN | 103632976 A | 3/2014 |
| CN | 103794505 A | 5/2014 |

(Continued)

*Primary Examiner* — Phat X Cao
(74) *Attorney, Agent, or Firm* — Slater Matsil, LLP

(57) ABSTRACT

A method for fabricating a semiconductor component includes forming an interlayer dielectric (ILD) layer on a substrate, forming a trench in the interlayer dielectric layer, forming a metal gate in the trench, removing a portion of the metal gate protruding from the ILD layer, reacting a reducing gas with the metal gate, and removing a top portion of the metal gate.

20 Claims, 6 Drawing Sheets

(51) Int. Cl.
*H01L 29/78* (2006.01)
*H01L 21/02* (2006.01)

(56) References Cited

U.S. PATENT DOCUMENTS

| | | | |
|---|---|---|---|
| 9,048,183 B2 | 6/2015 | Ganguli et al. | |
| 2003/0087513 A1* | 5/2003 | Noguchi | H01L 21/02074 438/627 |
| 2005/0245036 A1 | 11/2005 | Datta et al. | |
| 2013/0187203 A1 | 7/2013 | Xie et al. | |
| 2013/0187236 A1* | 7/2013 | Xie | H01L 29/4966 257/369 |
| 2013/0320412 A1* | 12/2013 | Yamasaki | H01L 21/823842 257/288 |
| 2014/0070320 A1* | 3/2014 | Mukherjee | H01L 21/823456 257/368 |
| 2014/0256152 A1* | 9/2014 | Ogawa | C23C 16/405 438/758 |
| 2015/0024584 A1* | 1/2015 | Wells | H01L 21/28088 438/589 |
| 2015/0041905 A1 | 2/2015 | Xie et al. | |
| 2015/0200089 A1 | 7/2015 | Suen et al. | |
| 2016/0343706 A1* | 11/2016 | Chang | H01L 27/0886 |

FOREIGN PATENT DOCUMENTS

| | | |
|---|---|---|
| JP | 2011124472 A | 6/2011 |
| KR | 1020030022728 A | 3/2003 |
| TW | 201142946 A1 | 12/2011 |
| TW | 201503264 A | 1/2015 |
| TW | 201519410 A | 5/2015 |

\* cited by examiner

METHOD FOR FABRICATING METAL GATE DEVICES AND RESULTING STRUCTURES

PRIORITY CLAIM AND CROSS-REFERENCE

This application claims priority to U.S. Provisional Application Ser. No. 62/194,736, filed Jul. 20, 2015, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. The smaller feature size is the use of multigate devices such as fin field effect transistor (FinFET) devices. FinFETs are so called because a gate is formed on and around a "fin" that extends from the substrate. As the term is implemented in the present disclosure, a FinFET device is any fin-based, multigate transistor. FinFET devices may allow for shrinking the gate width of device while providing a gate on the sides and/or top of the fin including the channel region. Another advancement implemented as technology nodes shrink, in some IC designs, has been the replacement of the typically polysilicon gate electrode with a metal gate electrode to improve device performance with the decreased feature sizes. One method of forming the metal gate electrode is a "gate last" or "replacement gate" methodology where a dummy gate, typically polysilicon is replaced by a metal gate. Providing the metal gate later in the process can avoid problems of the stability of the work function metal during processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2J illustrate different steps of a method of forming a FinFET device according to some embodiments of the disclosure, in which FIG. 2A to FIG. 2E are perspective views and FIG. 2F to FIG. 2J are cross-sectional views.

DETAILED DESCRIPTION

Figure 1:
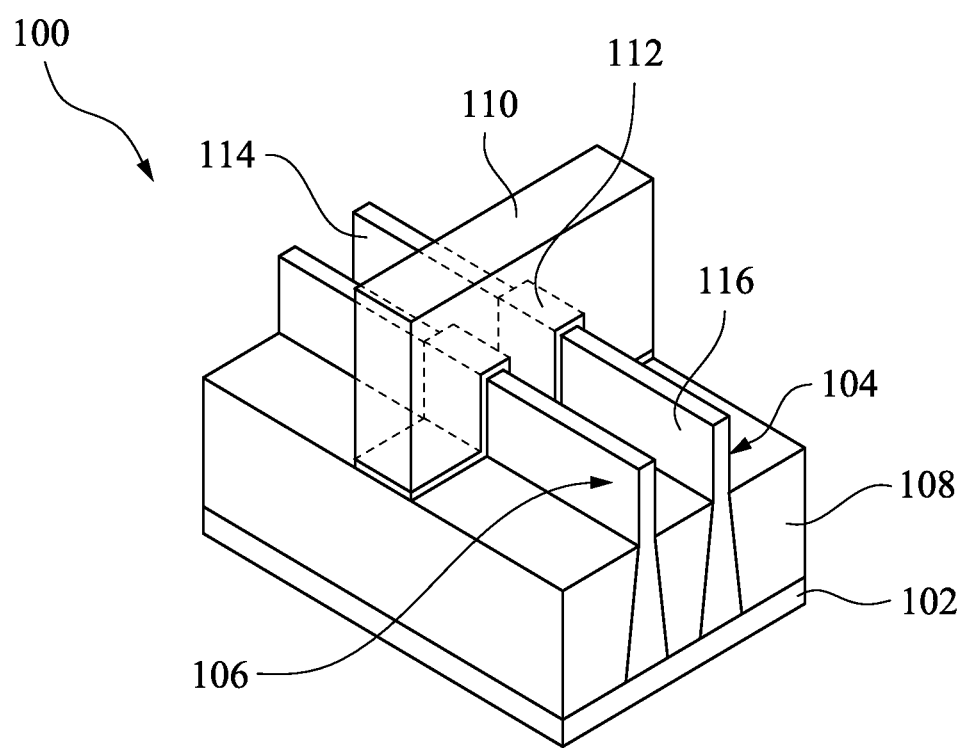
FIG. 1 is a perspective view of an embodiment of a FinFET device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates generally to semiconductor components, such as a FinFET device and method of fabricating a FinFET device or portion of a device. There has been a desire to replace the gate oxide and polysilicon gate electrode with a high-k gate dielectric and metal gate electrode to improve device performance as feature sizes continue to decrease. A gate last (or gate replacement) approach has been implemented to address concerns of high temperature processing on metal materials. However, challenges are raised in providing an appropriate stress and/or gate resistance in devices such as metal gate FinFETs. For example, low stress on the gate and/or high gate resistance can cause a degradation of performance of device. Therefore, there is a need to balance the stress and/or gate resistance in devices such as metal gate FinFETs, such that the gate leakage and/or work function can be improved.

FIG. 1 is a perspective view of an embodiment of a FinFET device according to some embodiments of the disclosure. The FinFET device 100 includes a substrate 102. In some embodiments, the substrate 102 includes a bulk silicon substrate. The substrate 102 may be silicon in a crystalline structure. In other embodiments, the substrate 102 may include other elementary semiconductors such as germanium, or include a compound semiconductor such as, silicon carbide, gallium arsenide, indium arsenide, and indium phosphide. In some other embodiments, the substrate 102 includes a silicon-on-insulator (SOI) substrate. The SOI substrate may be fabricated using separation by implantation of oxygen, wafer bonding, and/or other suitable methods.

The FinFET device 100 further includes fin structures 104, 106 (e.g., Si fins) that extend from the substrate 102. In some embodiments, the fin structures 104, 106 may optionally include germanium. The fin structures 104, 106 may be fabricated by using suitable processes such as photolithography and etch. In some embodiments, the fin structures 104, 106 are etched from the substrate 102 using dry etch or plasma processes. Shallow trench isolation (STI) structures 108 surround the fins 104, 106. The STI structures 108 may include any suitable insulating material. It is understood that although two fin structures are illustrated, additional parallel fins may be formed in a similar manner.

The FinFET device 100 further includes a gate structure 110. The gate structure 110 is formed on a central portion of the fin structures 104, 106. In some embodiments, multiple gate structures are formed over the fin structures. The gate structure 110 includes a gate dielectric layer and a gate electrode. It is understood that numerous other layers may also be present, for example, capping layers, interface layers, spacer elements, and/or other suitable features. In some embodiments, the gate dielectric layer may include an interfacial layer such as silicon oxide. The gate dielectric layer may further include other dielectric materials such as, silicon nitride, silicon oxinitride, dielectric with a high dielectric constant (high-k), and/or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide and/or combinations thereof. The gate electrode may include polysilicon and/or a metal including metal compounds such as, TiN, TaN, NiSi, CoSi, Mo, Cu, W, Al, Co, and/or other suitable conductive materials. The gate electrode may be formed in a gate last process (or gate replacement process) as will be explained below.

The fin structures 104, 106 include a channel region 112 surrounded by the gate structure 110. The fin structures 104, 106 may be doped to provide a suitable channel for an N-type FinFET (NMOS device) or P-type FinFET (PMOS device). The fin structures 104, 106 may be doped using processes such as, ion implantation, diffusion, annealing, and/or other suitable processes. The fin structures 104, 106 include a source region 114 and drain region 116 associated with the FinFET device 100. The source region 114 and drain region 116 may include an epitaxial (epi) silicon (Si) or epi silicon carbide (SiC) for an NMOS device, and epi silicon germanium (SiGe) or epi germanium (Ge) for a PMOS device. The FinFET device 100 may be a device included in a microprocessor, memory cell (e.g., SRAM), and/or other integrated circuits.

Figure 2A:
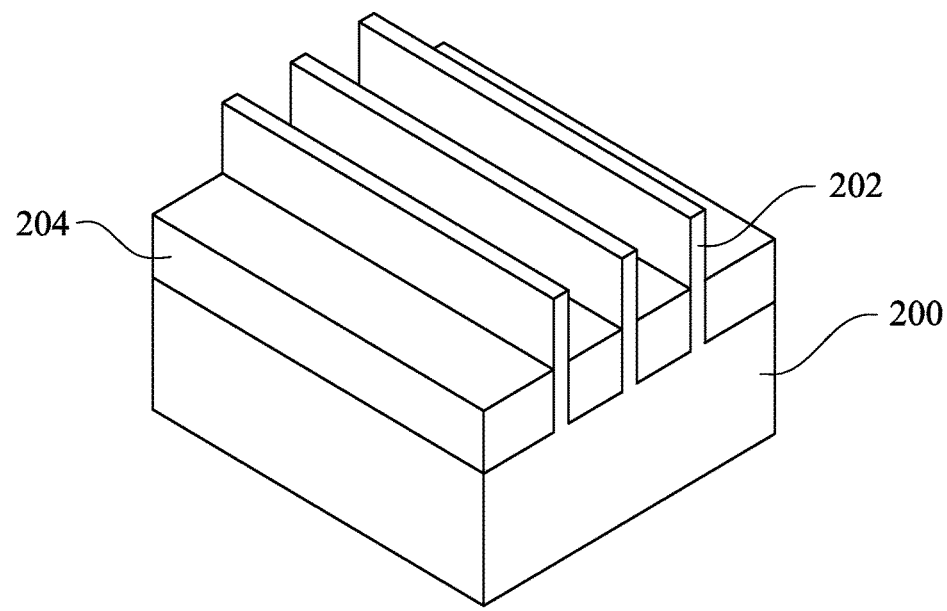

FIG. 2A to FIG. 2J illustrate different steps of a method of forming a FinFET device according to some embodiments of the disclosure, in which FIG. 2A to FIG. 2E are perspective views and FIG. 2F to FIG. 2J are cross-sectional views. In FIG. 2A, a semiconductor substrate is provided. The semiconductor substrate can be a silicon-containing substrate 200 with multiple fin structures 202 extending in a first direction. Thereafter, an insulating layer 204 is formed to fill the lower portions of gaps between the fin structures 202 as STI. The material of the insulating layer 204 can be, but is not limited to, silicon oxide. The method of forming the insulating layer 204 includes depositing an insulating material layer on the substrate 200 covering the fin structures 202, optionally performing a planarization process to make insulating layer 204 flat, and then performing an etch back process until the upper portions of the fin structures 202 are exposed. The fin structures 202 may includes source regions, drain regions, and channel regions connecting the source regions and the drain regions.

Figure 2B:
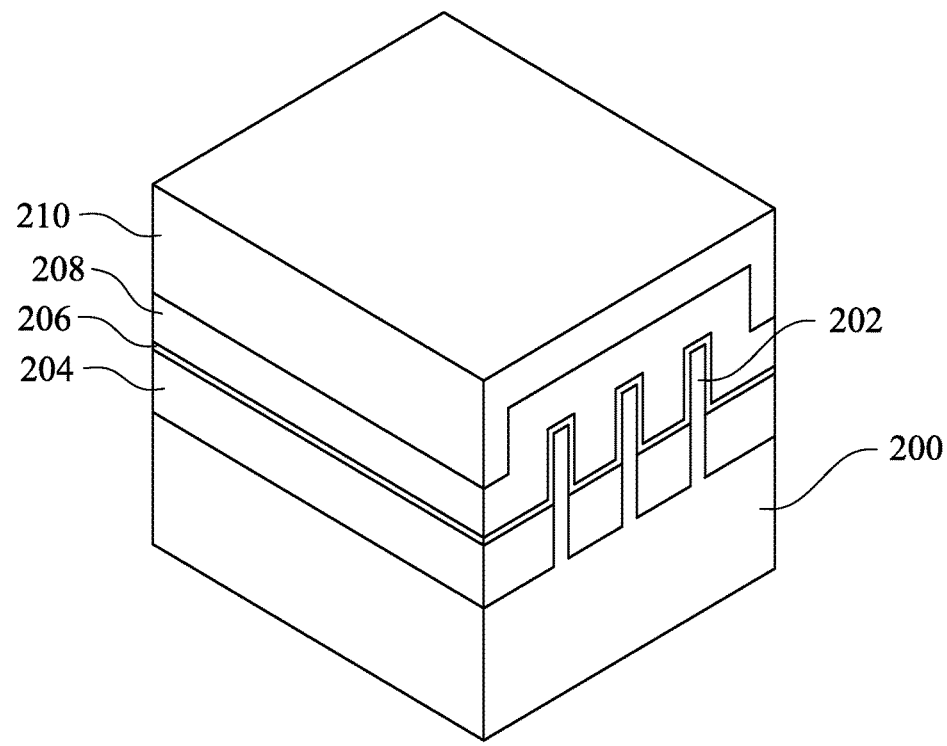

Referring to FIG. 2B, an interfacial layer 206 is conformally formed on the substrate 200 covering the fin structures 202. The interfacial layer 206 includes silicon oxide, silicon nitride or silicon oxynitride. The interfacial layer 206 is formed by a deposition process, such as an atomic layer deposition (ALD) process, a chemical vapor deposition (CVD) process, a physical vapor deposition (PVD) process or a sputter deposition process. It is noted that the interfacial layer 206 is formed by a deposition process rather than a thermal oxidation treatment. Silicon consumption due to the thermal oxidation treatment does not occur, so that the shape of the fins 102 is not deformed during the step of forming the interfacial layer 206. As shown in FIG. 2B, the interfacial layer 206 is conformally formed along the surface of each fin 202. In the present embodiment, since the interfacial layer 206 is formed by a deposition process without consuming any silicon, the shape of the fin structures 202 keeps well-defined after the formation of the interfacial layer 206.

Thereafter, a dummy gate material layer 208 and a mask layer 210 are sequentially formed on the interfacial layer 206. The dummy gate material layer 208 includes polysilicon. The mask layer 210 includes silicon oxide, silicon nitride, silicon oxynitride or a combination thereof. Each of the dummy gate material layer 208 and the mask layer 210 can be formed by a deposition process, such as an ALD process, a CVD process, a PVD process or a sputter deposition process. In FIG. 2B, a single mask layer 210 is provided for illustration purposes, but the present disclosure is not limited thereto. In another embodiment, the mask layer 210 can be a multi-layer structure including, for example, a lower silicon nitride layer and an upper silicon oxide layer.

Figure 2C:
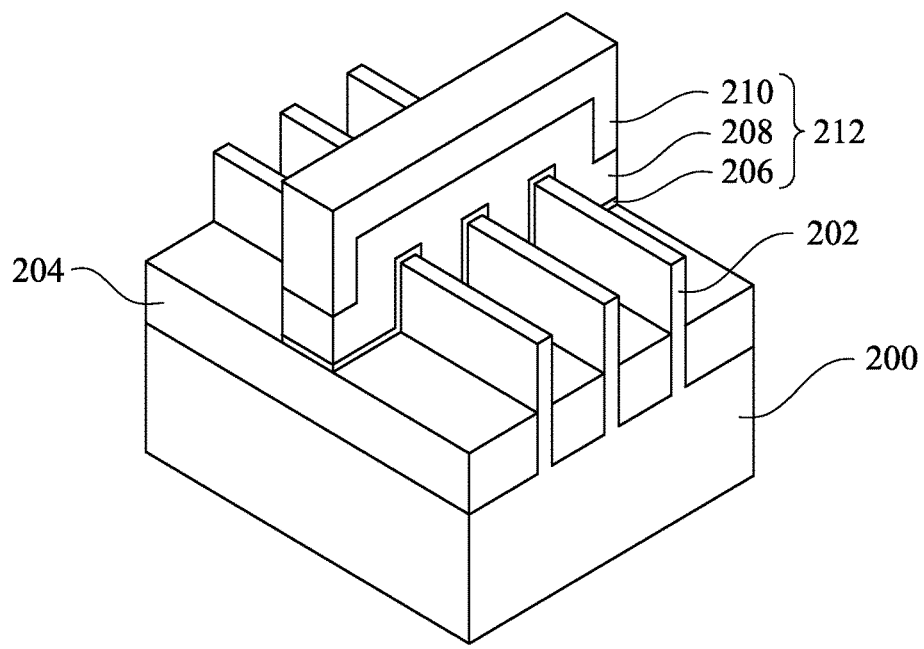

Referring to FIG. 2C, the mask layer 210, the dummy gate material layer 208 and the interfacial layer 206 are patterned to form a stacked structure 212 including the interfacial layer 206, the dummy gate material layer 208 and the mask layer 210 sequentially formed on the substrate 200. The stacked structure 212 crosses the fin structures 202 and extends in a second direction different from the first direction. In some embodiments, the second direction is perpendicular to the first direction. The patterning step includes performing photolithography and etching processes.

Figure 2D:
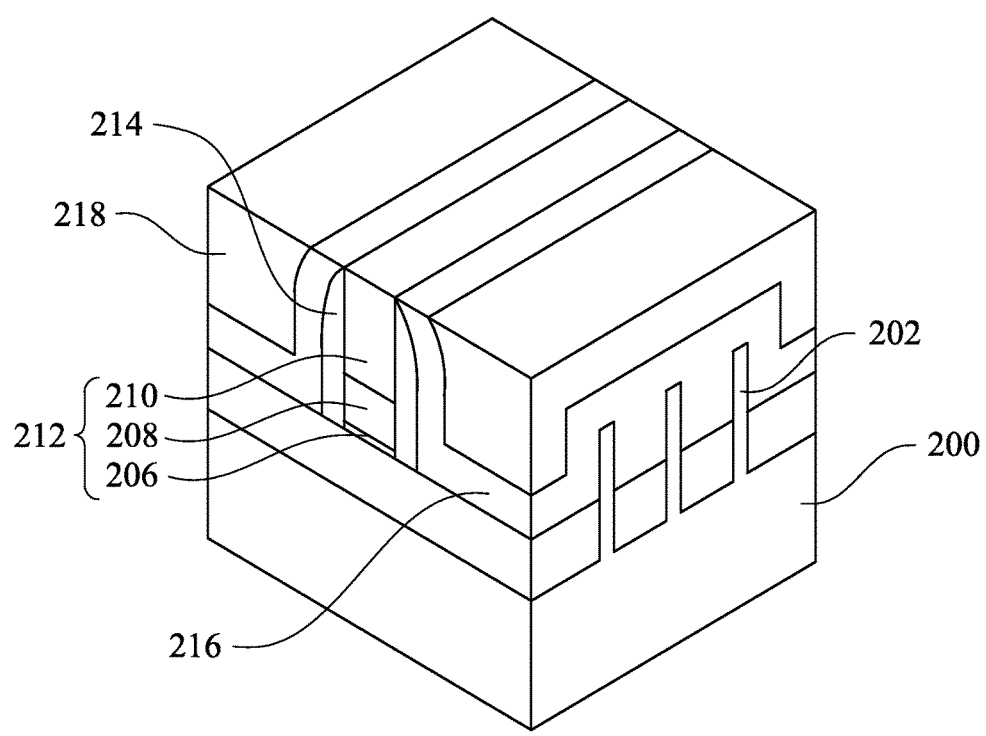

Referring to FIG. 2D, a spacer 214 is formed beside the stacked structure 212. The method of forming the spacer 214 includes forming a silicon oxide layer on the substrate 200 and then performing an anisotropic etching process to remove a portion of the silicon oxide layer. Source and drain regions (see FIG. 1) are then formed in the substrate 200 beside the spacer 214. Thereafter, a contact etch stop layer (CESL) 216 and an interlayer dielectric (ILD) layer 218 are sequentially formed on the substrate 200 to cover the stacked structure 212. The CESL 216 includes silicon nitride. The ILD layer 218 includes silicon oxide, silicon nitride, silicon oxynitride, silicon carbide, low-dielectric constant dielectric material or a combination thereof. Each of the CESL 216 and the ILD layer 218 can be formed by a deposition process, such as an ALD process, a CVD process, a PVD process or a sputter deposition process. Afterwards, a portion of the ILD layer 218 and a portion of the CESL 216 are removed to expose the top of the stacked structure 212. The removing step includes performing a CMP process.

Figure 2E:
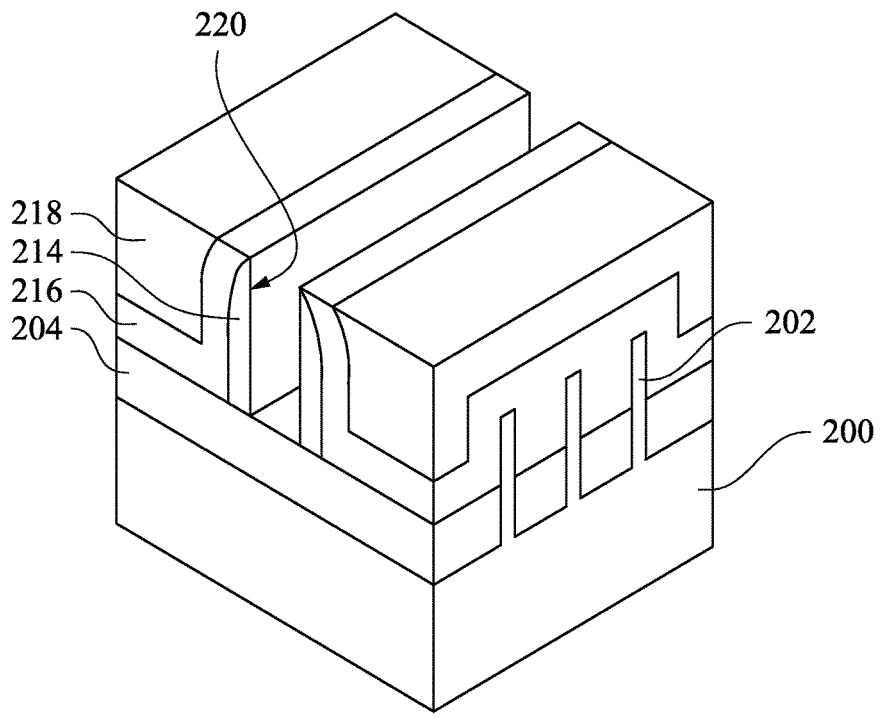

Referring to FIG. 2E, the stacked structure 212 is removed to form a trench 220 in the ILD layer 218. The removing step includes performing an etch back process. Note that the interfacial layer 206 can be regarded as a sacrificial layer since it is removed during the step of removing the stacked structure 212.

Figure 2F:
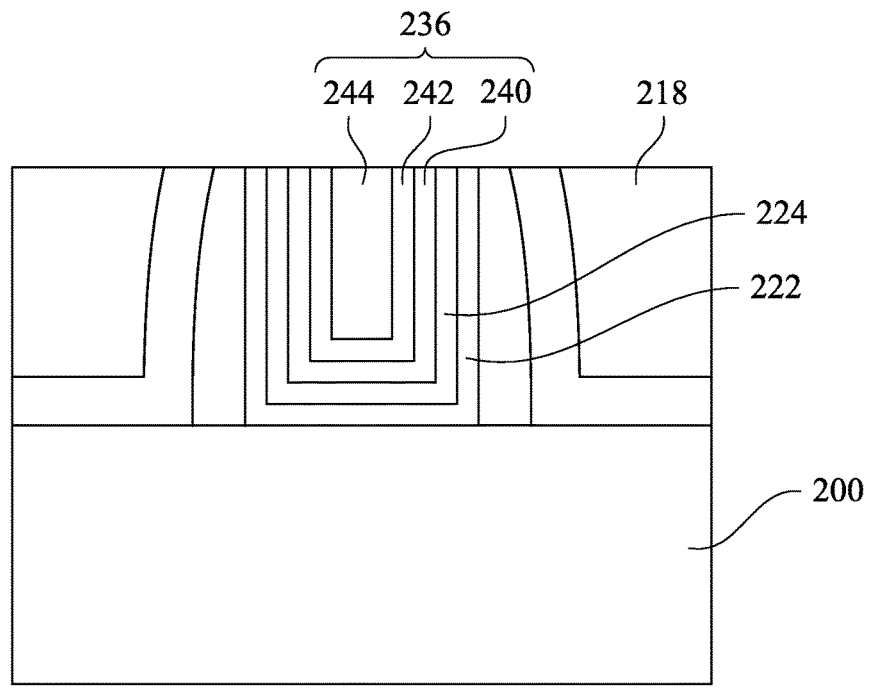

Referring to FIG. 2F, another interfacial layer 222 and a high-k dielectric layer 224, are sequentially formed at least on the surface of the trench 220. The interfacial layer 222 includes silicon oxide, silicon nitride or silicon oxynitride. The interfacial layer 222 is formed by a deposition process, such as an ALD process, a CVD process, a PVD process or a sputter deposition process. It is noted that the interfacial layer 222 is formed by a deposition process rather than a thermal oxidation treatment. Silicon consumption due to the thermal oxidation treatment does not occur, so that the shape of the fin structures 202 (see FIG. 2A) is not deformed during the step of forming the interfacial layer 222. The interfacial layer 222 is conformally formed along the surface of each fin 202. In the some embodiments, since the interfacial layer 222 is formed by a deposition process without consuming any silicon, the shape of the fin structures 202 keeps well-defined after the formation of the interfacial layer 222.

The high-k dielectric layer 224 includes a high-k material with high dielectric constant. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The high-k dielectric layer 224 is formed by a deposition process, such as an ALD process, a CVD process, a PVD process or a sputter deposition process.

Thereafter, a composite metal layer 236 is formed on the substrate 200 to at least fill up the trench 220 (shown in FIG. 2E) as a stacked metal gate. The composite metal layer 236 is formed filling the trench 220. The composite metal layer 236 includes, from bottom to top, a barrier layer 240, a work function metal layer 242, and a metal gate 244.

The barrier layer 240 is formed on and capping the high-k dielectric layer 224. The barrier layer 240 can be a metal layer, such as a titanium nitride (TiN) layer. The barrier layer 240 can be formed by a deposition process, such as an ALD process, a CVD process, a PVD process or a sputter deposition process. The barrier layer 240 can also be formed by a nitridation process, such as using a thermal chemical vapor deposition reaction between ammonia ($NH_3$) and titanium tetrachloride ($TiCl_4$). In some embodiments, the surface of the barrier layer 240 can be further treated by a nitridation process, such as using ammonia gas. Alternatively, in some embodiments, a post metal anneal (PMA) process can be utilized to improve the density and the quality of the high-k dielectric layer 224 and the barrier layer 240.

The work function metal layer 242 is formed on the barrier layer 240. In some embodiments, the FinFET device can be a NMOS device, and the work function metal layer 242 can be made of, for example, Ti, Ag, Al, TiAlMo, Ta, TaN, TiAlC, TiAlN, TaC, TaCN, TaSiN, Mn, Zr, or combinations thereof. Alternatively, the FinFET device can be a PMOS device, and the work function metal layer 242 can be made of, for example, TiN, W, Ta, Ni, Pt, Ru, Mo, Al, WN, or combinations thereof. The work function metal layer 242 can be formed by a deposition process, such as an ALD process, a CVD process, a PVD process or a sputter deposition process.

The metal gate 244 is formed on the work function metal layer 242. The metal gate 244 is deposited on the work function metal layer 242 by ALD, PVD, CVD, or other processes. The metal gate 244 is made of, for example, Al, W, Co, Cu.

In FIG. 2F, the interfacial layer 222, the high-k dielectric layer 224, and the composite metal layer 236 protruding from the ILD layer 218 (e.g. portions outside the trench 220) are removed. The FinFET device is thus obtained, wherein the high-k dielectric layer 224 serves as a gate dielectric layer, and the composite layer 236 serves as a metal gate electrode. The removing step can be performed by a CMP process.

After the surface of the FinFet device is flattened, there is a need to remove a portion of the interfacial layer 222, the high-k dielectric layer 224, and the metal gate 244 at the top in order to form a dielectric cap thereon. The dielectric cap is utilized to space the metal gate 244 from conductive circuits lying above. The removing step includes using etch back process.

However, the CMP slurry is an aqueous solution including suspensions, such as silica, alumina, ceria abrasive, oxidizers, polymers, pH stabilizers, dispersants, and surfactants. Those suspensions may be diffused into the metal gate 244 during the CMP process. The diffused portion of the metal gate 244 may occur etch back failure, which may impact SAC window and yield.

The present disclosure further includes applying a treatment to the metal gate 244, such that the etch back failure caused by diffusion can be prevented. The treatment includes applying a reduction gas to the metal gate 244, as shown in FIG. 2G to FIG. 2J, which are partial cross-sectional views of the semiconductor component according to some embodiments of the disclosure.

Figure 2G:
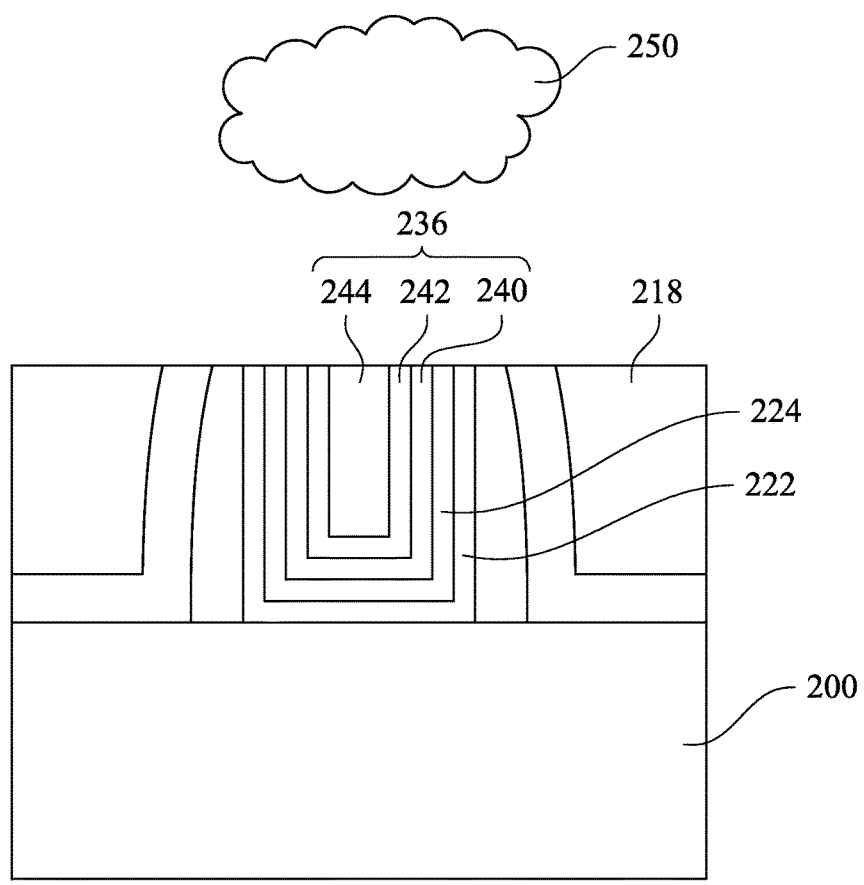

In FIG. 2G, the reduction gas 250 is led into the processing chamber. The reduction gas 250 is in contact with the metal gate 244. The reduction gas 250 includes reducing gas, which can react with the diffused suspensions in the metal gate 244. The reducing gas 250 has the ability to reduce the diffused suspensions (cause them to gain electrons). The reducing gas 250 is said to be reductive or reducing. The reducing gas 250 transfers electrons to the diffused suspensions, and is thus itself oxidized. Meanwhile, the diffused suspensions is said to be oxidative or oxidizing and can be known as oxidizing agents. That is, the diffused suspensions remove electrons from the reducing gas 250, and is thus itself reduced.

In some embodiments, the diffused suspensions may be the organic compounds or the diffused suspension may include chlorine. Accordingly, the reducing gas 250 has the ability to reduce carbon and chlorine. The reducing ability relates to redox potential (also known as reduction potential, oxidation/reduction potential) of the substance. Redox potential is a measure of the tendency of a chemical species to acquire electrons and thereby be reduced. Reduction potential is measured in volts (V), or millivolts (mV). Each species has its own intrinsic redox potential; the more positive the potential, the greater the species' affinity for electrons and tendency to be reduced.

However, the metal gate 244 is also made of the material which is able to be oxidized. Therefore, the redox potential of the reducing gas 250 need to be considered and cannot be too high in order to not to oxidize the metal gate 244 simultaneously when the diffused suspensions are reduced. In some embodiments, the metal gate 244 can be made of, for example, Al, W, Co, or Cu. The redox potential of the reducing gas 250 is greater than that of the compound of carbon or chlorine but is not greater than that of Al, W, Co, or Cu.

In some embodiments, the reducing gas 250 is a gas including hydrogen with dilute gas, such as $N_2$/Ar/He inert gas. The reducing gas can include $H_2N_2$. The reducing gas 250 may involve the use of hydrogen gas with a catalyst. These catalytic reductions are used primarily in the reduction of carbon-carbon bonds.

The processing chamber and the substrate 200 are further heated. In some embodiments, the processing chamber can be heated by applying optical techniques (tungsten filament lamps, lasers), thermal radiation techniques, or by using susceptors and radio frequency (RF) induction heating. The reducing gas 250 in the processing chamber is also heated and becomes high-temperature reducing gas 250, and the high-temperature reducing gas 250 is of a temperature in a range from about 200° C. to about 400° C. The hydrogen, including hydrogen atom and hydrogen ion, may penetrate into the metal gate 244. The hydrogen is able to reduce the diffused suspensions, such as compounds of carbon and/or chlorine, such that the diffused suspensions from the CMP slurry would not affect the following processes applying to the metal gate 244. In some embodiments, the reduction of carbon, such as organic compounds and/or reduction of chlorine (e.g. compounds of chlorine, such as Al(Cl)x or W(Cl)y) can be observed in the metal gate 244 after the reducing process.

Figure 2H:
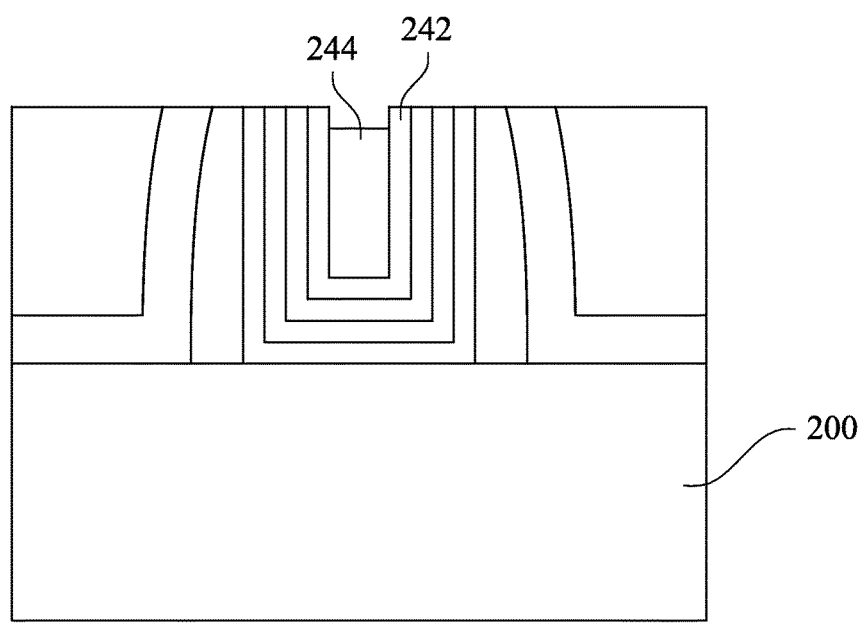

Referring to FIG. 2H. the top portion of the metal gate 244 is removed. The removing step includes performing etch back processes. In some embodiments, the removing step involves introducing an etchant into the processing chamber and reacting the etchant with the metal gate 244, in which the etchant has high selectivity between the metal gate 244 and the work function metal layer 242. The temperature may be selected based on etchant chemical composition, a desired etching rate, and other material and process parameters. In some embodiments, the etchant used in the etch back process is a fluorine based etchant, such as nitrogen trifluoride (NF), fluorine ($F_2$), tetrafluoromethane (CFO), tetrafluoroethylene ($C_2F_4$), hexafluoroethane ($C_2F_6$), octafluoropropane ($C_3F_8$), sulfur hexafluoride (SF), and others. In some embodiments, when the fluorine based etchant is utilized, the substrate is heated to a range between about 300° C. and 450° C. Other temperature ranges may be used for different types of etchants. The etchant may be introduced into the processing chamber from the remote plasma generator to provide activated species (including radicals, ions and/or high energy molecules). Flow rates of the etchant typically depend on a size of the chamber, etching rates, etching uniformity, and other parameters.

Figure 2I:
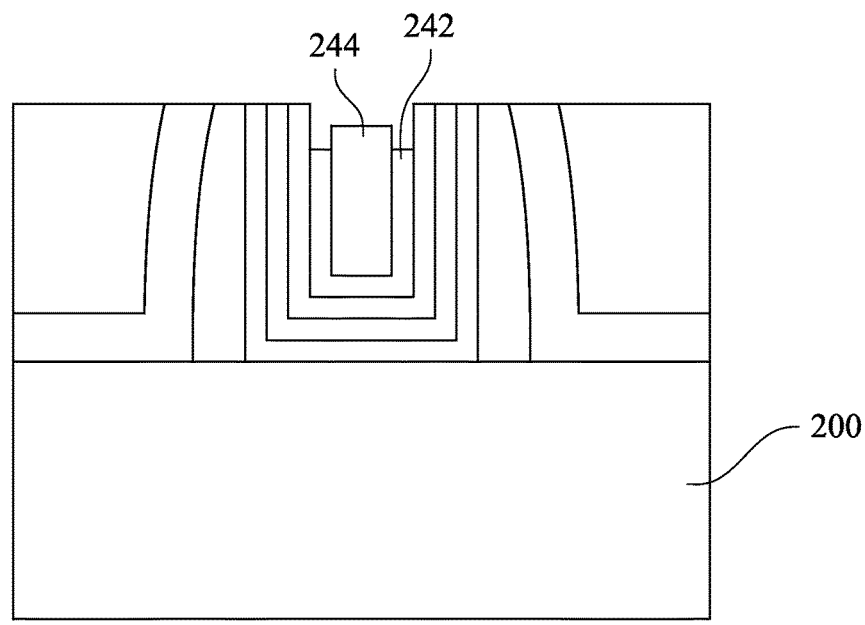

Referring to FIG. 2I, the top portion of the work function metal layer 242 is removed after the metal gate 244 is etched back. The etching process may implement etchant different from that of etching the metal gate 244. The etchant utilized to remove the work function metal layer 242 also has high selectivity between the work function metal later 242 and the metal gate 244. In some embodiments, the etchant may be chlorine-based etchant, such as chlorine ($Cl_2$), trichloromethane ($CHCl_3$), carbon tetrachloride ($CCl_4$), and/or boron trichloride ($BCl_3$), bromine-containing gas, such as hydrogen bromide (HBr) and/or tribromomethane ($CHBr_3$), iodine-containing gas, other suitable gases and/or plasmas, and/or combinations thereof.

The metal gate 244 and the work function metal layer 242 are two-step etched to gain high etching selectivity. The metal gate 244 is protruded from the work function metal layer 242. Namely, the height of the metal gate 244 is greater than that of the work function metal layer 242. In some embodiments, the distance between the top surface of the metal gate 244 and the work function metal layer 242 is in a range from about 1 nm to about 5 nm.

Figure 2J:
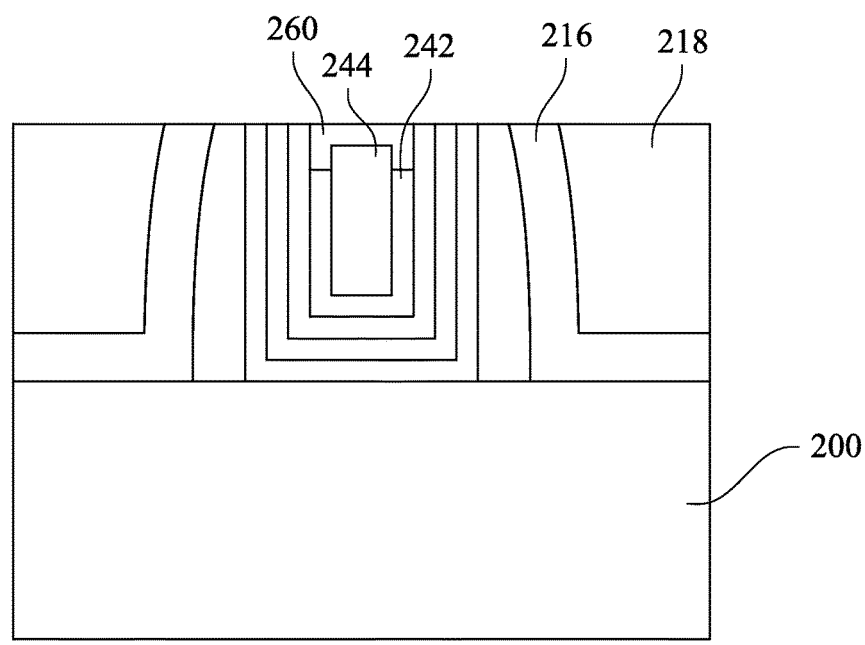

Referring to FIG. 2J, a dielectric layer 260 is formed on and capping the metal gate 244 and the work function metal layer 242. The dielectric layer 260 fills the trench 220. The dielectric layer 260 includes silicon oxide, silicon nitride, silicon oxynitride, silicon carbide, low-dielectric constant dielectric material or a combination thereof. The dielectric layer 260 can be formed by a deposition process, such as an ALD process, a CVD process, a PVD process or a sputter deposition process. Afterwards, a portion of the dielectric layer 260 protruding from the trench 220 (shown in FIG. 2E) is removed. The removing step includes performing a CMP process. The top surface of the dielectric layer 260, the ILD layer 218, and the CESL 216 are substantially at the same level, such that the semiconductor component, e.g. the FinFet device may provide a flatten top surface for forming circuits thereon, and the dielectric layer 260 is utilized to isolate the circuit and the metal gate 244.

By inducing the reducing gas into the processing chamber, the diffused suspensions in the metal gate can be reduced, such that the etch back process to the metal gate can be performed successfully.

According to some embodiments of the disclosure, a method for fabricating a semiconductor component includes forming an interlayer dielectric (ILD) layer on a substrate, forming a trench in the interlayer dielectric layer, forming a metal gate in the trench, removing a portion of the metal gate protruding from the ILD layer, reacting a reducing gas with the metal gate, and removing a top portion of the metal gate.

According to some embodiments of the disclosure, a method for fabricating a FinFet device includes forming an interlayer dielectric (ILD) layer on a substrate, forming a trench in the interlayer dielectric layer, forming a work function metal layer and a metal gate in the trench, wherein the work function metal layer is between the trench and the metal gate, forming a drain region and a source region at opposite sides of the metal gate, removing a portion of the metal gate and the work function metal layer protruding from the ILD layer by a CMP process, reacting a reducing gas with the metal gate, removing a top portion of the metal gate and a top portion of the work function metal layer, and forming a dielectric layer on the metal gate and the work function metal layer.

According to some embodiments of the disclosure, a semiconductor component includes an interlayer dielectric layer having a trench, a metal gate formed in the trench, a work function metal layer formed between the metal gate and the trench, wherein a height of the metal gate is greater than that of the work function metal layer, and a dielectric layer formed on the metal gate and the work function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor component comprising:
   forming an interlayer dielectric (ILD) layer on a substrate;
   forming a trench in the ILD layer;
   forming a metal gate from a conductive material in the trench;
   removing a portion of the metal gate protruding from the ILD layer with a CMP process, suspensions of a CMP slurry from the CMP process being diffused into the metal gate during the CMP process;
   reacting a reducing gas with the metal gate, a redox potential of the reducing gas being less than a redox potential of the conductive material and greater than a redox potential of the suspensions diffused into the metal gate; and
   removing a top portion of the metal gate.

2. The method of claim 1, wherein the reducing gas reduces the suspensions diffused into the metal gate.

3. The method of claim 2, wherein the suspensions comprises compounds of carbon, chlorine, and combinations thereof.

4. The method of claim 2, wherein the reducing gas has ability to reduce carbon.

5. The method of claim 4, wherein the reducing gas comprises hydrogen.

6. The method of claim 4, wherein the reducing gas comprises diazene.

7. The method of claim 1, further comprising heating the substrate when the reducing gas reacts with the metal gate.

8. The method of claim 1, wherein the step of removing a top portion of the metal gate comprises etching back the metal gate.

9. A method for fabricating a FinFET device comprising:
forming an interlayer dielectric (ILD) layer on a substrate;
forming a trench in the ILD layer;
forming a work function metal layer and a metal gate in the trench, wherein the work function metal layer is between the trench and the metal gate;
forming a drain region and a source region at opposite sides of the metal gate;
removing a portion of the metal gate and the work function metal layer protruding from the ILD layer by a CMP process, suspensions of a CMP slurry from the CMP process being diffused into the metal gate during the CMP process;
reacting a reducing gas with the metal gate, a redox potential of the reducing gas being less than a redox potential of a material of the metal gate and greater than a redox potential of the suspensions of the CMP slurry;
removing a top portion of the metal gate and a top portion of the work function metal layer; and
forming a dielectric layer on the metal gate and the work function metal layer, the dielectric layer extending along top surfaces of the metal gate and the work function metal layer and along sidewalls of the metal gate.

10. The method of claim 9, wherein the metal gate is made of Al, W, Co, Cu, or combinations thereof, and the reducing gas is not able to oxidize the metal gate.

11. The method of claim 10, wherein suspensions of a CMP slurry are diffused into the metal gate during the CMP process, and the reducing gas is able to reduce the suspensions.

12. The method of claim 9, wherein suspensions of a CMP slurry are diffused into the metal gate during the CMP process, and the reducing gas is able to reduce the suspensions.

13. The method of claim 9, wherein the reducing gas comprises hydrogen.

14. The method of claim 9, wherein the reducing gas comprises diazene.

15. The method of claim 9, wherein the removing the top portions of the metal gate and the work function metal layer comprises performing etch back processes.

16. The method of claim 15, wherein removing the top portion of the work function metal layer is performed after removing the top portion of the metal gate.

17. The method of claim 15, wherein an etchant for removing the metal gate is different from that for removing the work function metal layer.

18. The method of claim 9, further comprising:
forming a barrier layer in the trench, wherein the barrier layer is between the trench and the work function metal layer, wherein the dielectric layer extends along sidewalls of the barrier layer.

19. A method comprising:
depositing an interlayer dielectric layer;
patterning the interlayer dielectric layer to have a trench therein;
lining the trench with a barrier layer and a work function metal layer;
filling the lined trench with a conductive material, the conductive material having a first redox potential;
planarizing the conductive material with a planarization process to form a metal gate, suspensions of a slurry used during the planarization process being diffused into the conductive material, the suspensions having a second redox potential;
exposing the metal gate to a reducing gas, the reducing gas having a third redox potential, the third redox potential being less than the first redox potential and greater than the second redox potential; and
depositing a dielectric layer on the metal gate and the work function metal layer, the dielectric layer extending along sides of the barrier layer and the metal gate.

20. The method of claim 19, further comprising removing a top portion of the metal gate and a top portion of the work function metal layer.

* * * * *